(12) United States Patent
Liu et al.

(10) Patent No.: US 11,552,248 B2
(45) Date of Patent: Jan. 10, 2023

(54) ORGANIC LIGHT EMITTING DEVICE AND METHOD OF MANUFACTURING SAME

(71) Applicant: Shenzhen China Star Optoelectronics Semiconductor Display Technology Co., Ltd., Shenzhen (CN)

(72) Inventors: Hualong Liu, Shenzhen (CN); Tsungyuan Wu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/605,398

(22) PCT Filed: May 13, 2019

(86) PCT No.: PCT/CN2019/086583
§ 371 (c)(1),
(2) Date: Oct. 15, 2019

(87) PCT Pub. No.: WO2020/199308
PCT Pub. Date: Oct. 8, 2020

(65) Prior Publication Data
US 2022/0052261 A1 Feb. 17, 2022

(30) Foreign Application Priority Data
Apr. 4, 2019 (CN) .......................... 201910272539.5

(51) Int. Cl.
*H01L 51/52* (2006.01)
*H01L 51/00* (2006.01)
*H01L 27/32* (2006.01)

(52) U.S. Cl.
CPC ...... *H01L 51/0005* (2013.01); *H01L 27/3246* (2013.01); *H01L 51/52* (2013.01)

(58) Field of Classification Search
CPC .................................................. H01L 27/3246
See application file for complete search history.

(56) References Cited

U.S. PATENT DOCUMENTS

2014/0151651 A1    6/2014  Jin et al.
2014/0361265 A1*  12/2014  Liu .................... H01L 51/5271
                                                                    257/40

(Continued)

FOREIGN PATENT DOCUMENTS

| CN | 103594661 A | 2/2014 |
| CN | 108231836 A | 6/2018 |
| CN | 108832009 A | 11/2018 |

OTHER PUBLICATIONS

Xu et al., Low-Roughness and Easily-Etched Transparent Conducting Oxides with a Stack Structure of ITO and IZO, Sep. 11, 2013, EOS Journal of Solid State Science and Technology, 2(11) R245-R248. (Year: 2013).*

*Primary Examiner* — Fernando L Toledo
*Assistant Examiner* — Valerie N Newton
(74) *Attorney, Agent, or Firm* — Nathan & Associates; Menachem Nathan

(57) ABSTRACT

An organic light emitting device and a method of manufacturing the same are provided. The organic light emitting device, from bottom to top, includes a substrate, an indium tin oxide layer, a semiconductor layer, and a pixel defining layer. The semiconductor layer covers foreign particles on the indium tin oxide layer to make the indium tin oxide layer have an even thickness. The method of manufacturing the organic light emitting device including steps of providing an indium tin oxide layer, providing a semiconductor layer, patterning, and providing a pixel defining layer. The disclosure prevents from uneven brightness (mura) causing from a bright spot or a dark spot appearing at the foreign particles and ensures an overall even brightness of the organic light (Continued)

emitting device by providing the semiconductor layer disposed on the indium tin oxide layer to cover foreign particles on the indium tin oxide layer.

8 Claims, 3 Drawing Sheets

(56) References Cited

U.S. PATENT DOCUMENTS

2018/0166649 A1 6/2018 Woo
2019/0371871 A1 12/2019 He et al.

* cited by examiner

ORGANIC LIGHT EMITTING DEVICE AND METHOD OF MANUFACTURING SAME

FIELD OF INVENTION

The present disclosure relates to display technologies, and more particularly, to an organic light emitting device and a method of manufacturing the same.

BACKGROUND OF INVENTION

Organic light emitting diodes (OLEDs) have been widely used in display field, lighting field and smart wearable device field due to their good self-luminous characteristics, high contrast and fast response times.

Main methods for preparing organic light emitting devices are vapor deposition and printing. Now, technologies of preparing large, medium or small-sized organic light-emitting devices by full evaporation method are quite mature compared with printing technology, and have been used for commercial production. However, full evaporation technology has a problem that material utilization rate is low and it is difficult to prepare a high-resolution device. The material utilization rate of the printing technology preparing device is as high as 90% or more. Cost of preparing the device by the printing technology is about 17% lower than that of the full evaporation technology. Masks are not required in the printing process. The printing technology can be used for preparation of a high-resolution display device. Therefore, preparation of large-size, and high-resolution organic light-emitting devices is a research hotspot in the display field.

FIG. 1 is a schematic diagram of a process for fabricating an organic light emitting device using a prior art printing process. The printing process is as follows: forming an indium tin oxide layer 2 on a substrate 1, and preparing a wall structure 41 (bank) after pattering the indium tin oxide layer 2. The indium tin oxide layer 2 at the bottom is a hydrophilic substance, the surrounding wall structure 41 is a hydrophobic substance, and area of an edge portion of the indium tin oxide layer 2 overlays with the wall structure 41. However, it was found in the printing process that there are micron-sized foreign particles 21 in some of pixels on a surface of the indium tin oxide layer 2, so that causing a foreign object protrusion at a thin functional layer 42 after drying when the printing process is completed. Thereby causing a problem of uneven brightness (mura) because a bright spot or a dark spot appearing at the foreign particles 21 when the device emits light, therefore, resulting in overall uneven brightness of the organic light-emitting device.

Therefore, there is a need to solve the above problems.

SUMMARY OF INVENTION

In view of the above, the present disclosure provides an organic light emitting device and a method of manufacturing the same to resolve above-mentioned technical problem that uneven brightness causing from a bright spot or a dark spot appearing at foreign particles, and to prevent from overall uneven brightness of the organic light-emitting device.

In order to achieve above-mentioned object of the present disclosure, one embodiment of the disclosure provides an organic light emitting device including a substrate, an indium tin oxide layer disposed on the substrate, a semiconductor layer disposed on the indium tin oxide layer; and a pixel defining layer disposed on the semiconductor layer.

The semiconductor layer covers the indium tin oxide layer to make the indium tin oxide layer have an even thickness.

In one embodiment of the disclosure, a thickness of the semiconductor layer ranges from 3 nm to 10 μm.

In one embodiment of the disclosure, light transmittance of the semiconductor layer is greater than 80%.

In one embodiment of the disclosure, a material of the semiconductor layer is indium zinc oxide or indium germanium zinc oxide.

In one embodiment of the disclosure, the semiconductor layer is made by chemical vapor deposition, physical vapor deposition, spin coating, or print.

In one embodiment of the disclosure, the substrate is a thin film transistor substrate.

In one embodiment of the disclosure, the pixel defining layer includes a barrier structure surrounding the semiconductor layer, and a functional layer disposed on the semiconductor layer surrounded by the barrier structure.

In one embodiment of the disclosure, the functional layer is made by inkjet print.

Furthermore, another embodiment of the disclosure provides a method of manufacturing the organic light emitting device including steps of providing an indium tin oxide layer, providing a semiconductor layer, patterning, and providing a pixel defining layer. The step of providing an indium tin oxide layer includes steps of providing a substrate, and providing the indium tin oxide layer on the substrate.

The step of providing a semiconductor layer includes a step of providing the semiconductor layer on the indium tin oxide layer by chemical vapor deposition, physical vapor deposition, spin coating, or print. A material of the semiconductor layer is indium zinc oxide or indium germanium zinc oxide. A film thickness of the semiconductor layer ranges from 3 nm to 10 μm;

The step of patterning includes a step of pattering the indium tin oxide layer and the semiconductor layer. A patterned region of the indium tin oxide layer after patterning and a patterned region of the semiconductor layer after patterning are located corresponding to a light emitting region of the organic light emitting device.

The step of providing a pixel defining layer includes a step of providing the pixel defining layer on the semiconductor layer.

In one embodiment of the disclosure, the step of providing the pixel defining layer includes providing a barrier structure, and providing a functional layer. The step of providing a barrier structure includes a step of providing the barrier structure surrounding the semiconductor layer. The barrier structure and the semiconductor layer are partially overlapped.

The step of providing a functional layer includes a step of providing the functional layer on the semiconductor layer surrounded by the barrier structure by means of inkjet print.

In comparison with prior art, the organic light emitting device and the method of manufacturing the same of the disclosure prevent from uneven brightness causing from a bright spot or a dark spot appearing at the foreign particles and ensure overall even brightness of the organic light emitting device by providing the semiconductor layer disposed on the indium tin oxide layer to cover foreign particles on the indium tin oxide layer.

Reference numbers of the present disclosure are as follows:

1: substrate; 2: indium tin oxide layer; 3: semiconductor layer; 4: pixel defining layer; 21: foreign particles; 41: barrier structure; 42: functional layer

DETAILED DESCRIPTION OF PREFERRED EMBODIMENTS

The following description of the embodiments is provided by reference to the following drawings and illustrates the specific embodiments of the present disclosure. Directional terms mentioned in the present disclosure, such as "up," "down," "top," "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

Figure 1:
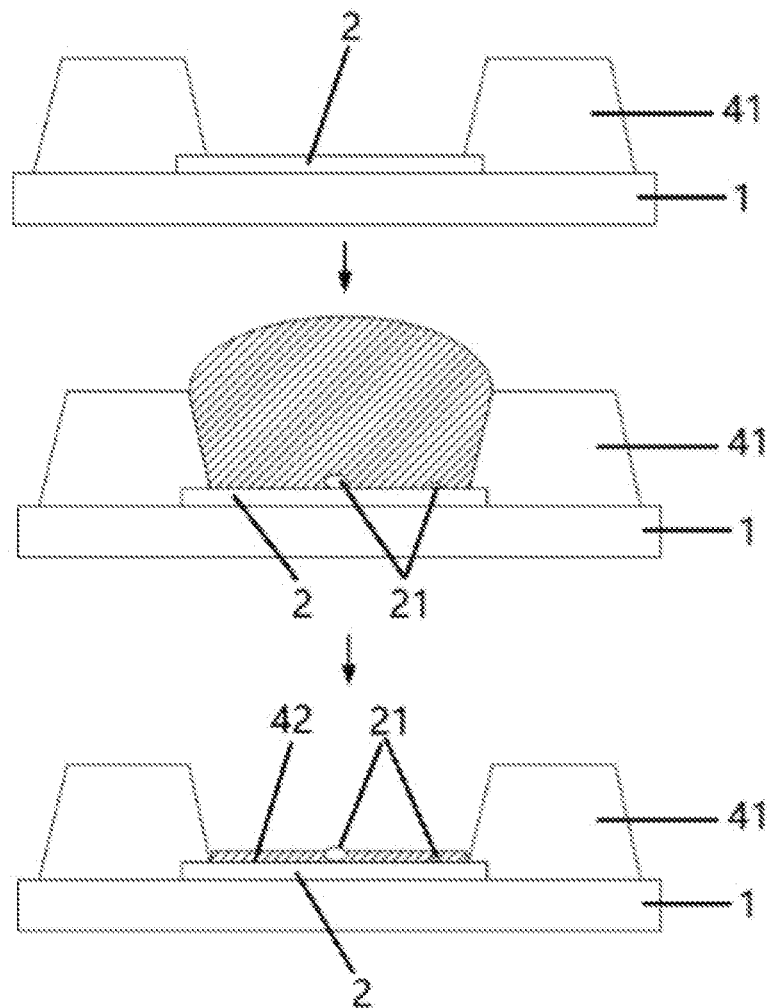
FIG. 1 is a schematic diagram of a process for fabricating an organic light emitting device according to prior art.
Figure 2:
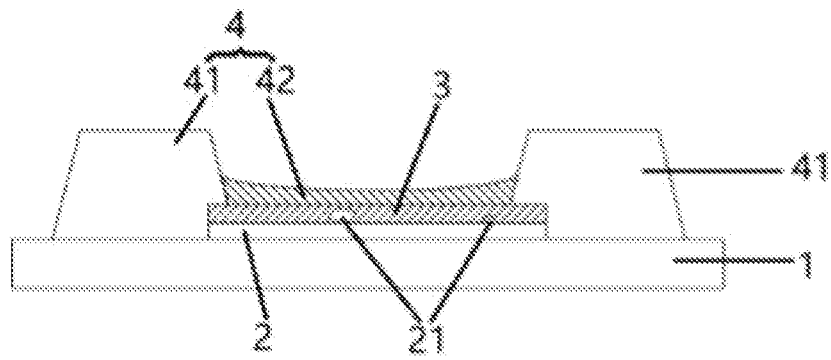
FIG. 2 is a schematic view of a structure of an organic light emitting device according to an embodiment of the present disclosure.

Referring to FIG. 2, one embodiment of the disclosure provides an organic light emitting device, from bottom to top, including a substrate 1, an indium tin oxide layer 2, a semiconductor layer 3, and a pixel defining layer 4. In detail, the indium tin oxide layer 2 is disposed on the substrate 1. The semiconductor layer 3 is disposed on the indium tin oxide layer 2, and the pixel defining layer 4 is disposed on the semiconductor layer 3. The semiconductor layer 3 covers foreign particles 21 on the indium tin oxide layer 2 to make the indium tin oxide layer 2 have an even thickness, so as to prevent from uneven brightness causing from a bright spot or a dark spot appearing at the foreign particles 21 and ensure an overall even brightness of the organic light emitting device.

In one embodiment of the disclosure, a thickness of the semiconductor layer 3 ranges from 3 nm to 10 μm.

In one embodiment of the disclosure, a material of the semiconductor layer 3 is a transparent material or a translucent material with light transmittance greater than 80% so as not to affect light transmittance of the device, such as indium zinc oxide (IZO) or indium germanium zinc oxide (IGZO).

In one embodiment of the disclosure, the semiconductor layer 3 is made by chemical vapor deposition (CVD), physical vapor deposition (PVD), spin coating, or print.

In one embodiment of the disclosure, the substrate 1 is a thin film transistor substrate.

In one embodiment of the disclosure, the pixel defining layer 4 includes a barrier structure 41 surrounding the semiconductor layer 3, and a functional layer 42 disposed on the semiconductor layer 3 surrounded by the barrier structure 41. A material of the barrier structure 41 is light blocking material for preventing light leakage.

In one embodiment of the disclosure, the functional layer 42 is made by inkjet printing.

Figure 3:
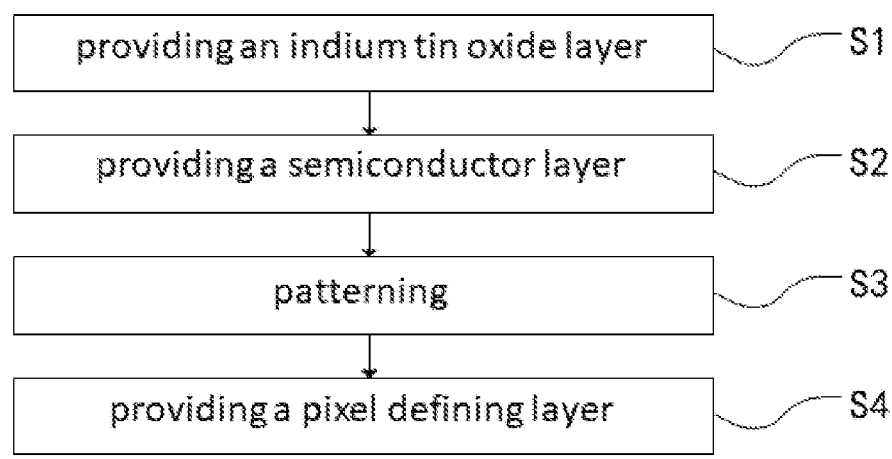
FIG. 3 is a schematic view of a flowchart of a method of manufacturing the organic light emitting device according to an embodiment of the present disclosure.
Figure 5:
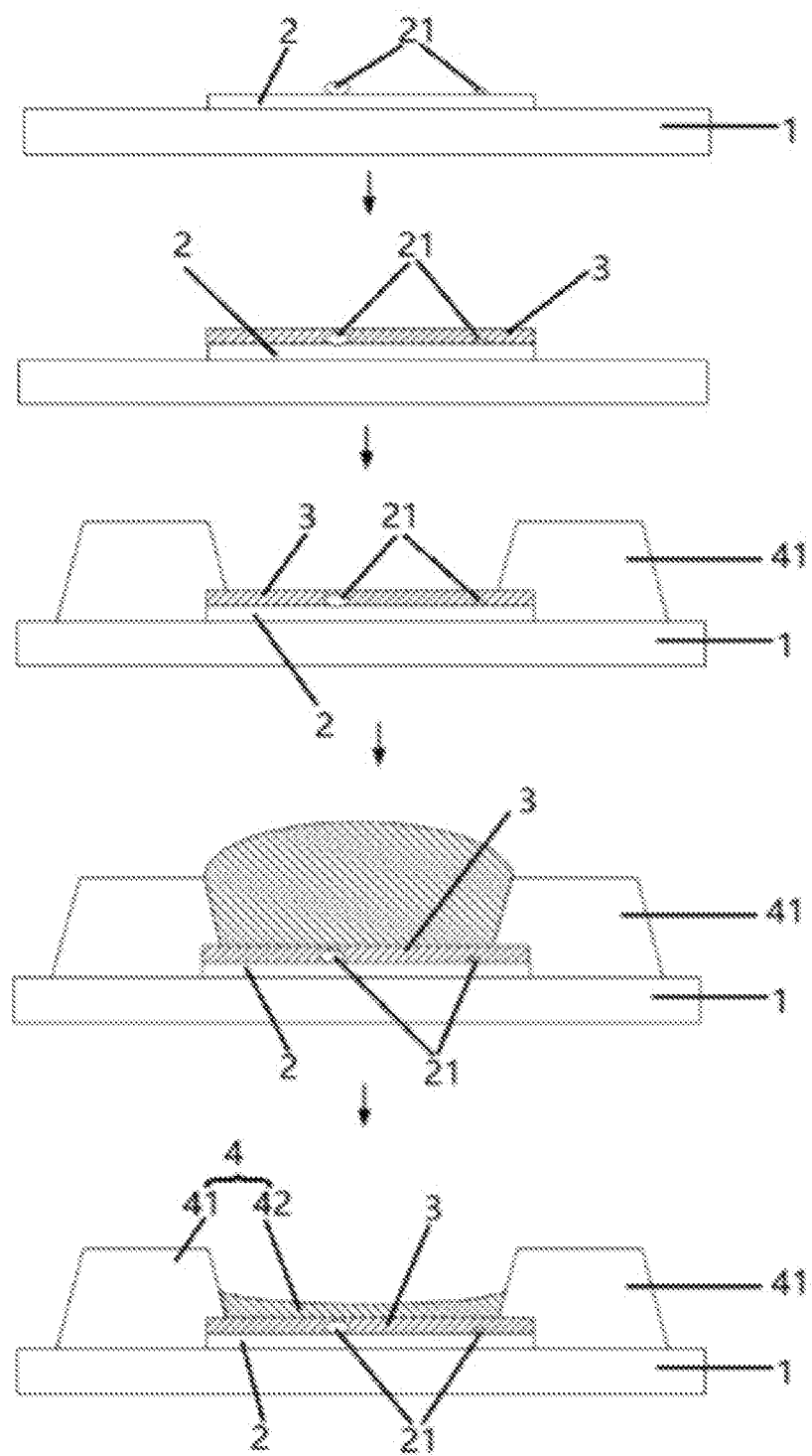
FIG. 5 is a schematic view of a scenario of the manufacturing method in FIG. 3.

Referring to FIGS. 3 and 5, another embodiment of the disclosure provides a method of manufacturing the organic light emitting device including steps of: at block S1: providing an indium tin oxide layer, at block S2: providing a semiconductor layer, at block S3: patterning, and at block S4: providing a pixel defining layer. At block S1: the step of providing an indium tin oxide layer includes steps of providing a substrate 1, and providing the indium tin oxide layer 2 on the substrate 1.

At block S2: the step of providing a semiconductor layer includes a step of providing the semiconductor layer 3 on the indium tin oxide layer 2 by CVD, PVD, spin coating, or printing. a material of the semiconductor layer 3 is a transparent material or a translucent material. A film thickness of the semiconductor layer 3 ranges from 3 nm to 10 μm. The semiconductor layer 3 covers foreign particles 21 on the indium tin oxide layer 2 to make the indium tin oxide layer 2 have an even thickness At block S3: the step of patterning includes a step of patterning the indium tin oxide layer 2 and the semiconductor layer 3. A patterned region of the indium tin oxide layer 2 after patterning and a patterned region of the semiconductor layer 3 after patterning are located corresponding to a light emitting region of the organic light emitting device.

At block S4: the step of providing a pixel defining layer includes a step of providing the pixel defining layer 4 on the semiconductor layer 3.

Figure 4:
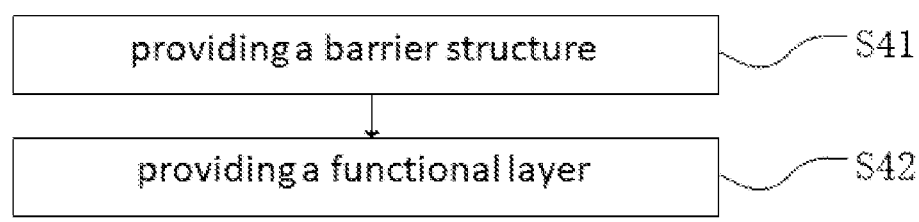
FIG. 4 is a schematic view of a flowchart of step S4 in FIG. 3.

Referring to FIG. 4, in one embodiment of the disclosure, the step of providing the pixel defining layer includes: at block S41: providing a barrier structure, and at block S42: providing a functional layer. The step of providing a barrier structure at block S41 includes a step of providing the barrier structure 41 surrounding the semiconductor layer 3. The barrier structure 41 and the semiconductor layer 3 are partially overlapped.

The step of providing a functional layer at block S42 includes a step of providing the functional layer 42 on the semiconductor layer 3 surrounded by the barrier structure 41 by means of inkjet print.

In comparison with prior art, the organic light emitting device and the method of manufacturing the same of the disclosure prevent from uneven brightness causing from a bright spot or a dark spot appearing at the foreign particles and ensure the overall even brightness of the organic light emitting device by providing the semiconductor layer disposed on the indium tin oxide layer to cover foreign particles on the indium tin oxide layer.

The present disclosure has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. An organic light emitting device, comprising:
a substrate;
an indium tin oxide layer disposed on the substrate;
a semiconductor layer disposed on the indium tin oxide layer and directly contacted the indium tin oxide layer; and
a pixel defining layer disposed on the semiconductor layer, wherein the semiconductor layer covers the indium tin oxide layer to make the indium tin oxide layer have an even thickness, wherein a thickness of the semiconductor layer is greater than 5 nm and less than 10 μm and a material of the semiconductor layer is indium germanium zinc oxide.

2. The organic light emitting device according to claim 1, wherein light transmittance of the semiconductor layer is greater than 80%.

3. The organic light emitting device according to claim 1, wherein the semiconductor layer is made by chemical vapor deposition, physical vapor deposition, spin coating, or printing.

4. The organic light emitting device according to claim 1, wherein the substrate is a thin film transistor substrate.

5. The organic light emitting device according to claim 1, wherein the pixel defining layer comprises:
    a barrier structure surrounding the semiconductor layer; and
    a functional layer disposed on the semiconductor layer surrounded by the barrier structure.

6. The organic light emitting device according to claim 5, wherein the functional layer is made by inkjet print.

7. A method of manufacturing the organic light emitting device according to claim 1, comprising steps of:
    providing an indium tin oxide layer comprising steps of providing a substrate, and providing the indium tin oxide layer on the substrate, wherein a thickness of the indium tin oxide ranges from 1 µm to 5 µm;
    providing a semiconductor layer comprising a step of providing the semiconductor layer on the indium tin oxide layer and directly contacted the indium tin oxide layer by chemical vapor deposition, physical vapor deposition, spin coating, or print;
    patterning comprising a step of pattering the indium tin oxide layer and the semiconductor layer, wherein a patterned region of the indium tin oxide layer after patterning and a patterned region of the semiconductor layer after patterning are located corresponding to a light emitting region of the organic light emitting device; and
    providing a pixel defining layer comprising a step of providing the pixel defining layer on the semiconductor layer.

8. The method of manufacturing the organic light emitting device according to claim 7, wherein the step of providing the pixel defining layer comprises:
    providing a barrier structure comprising a step of providing the barrier structure surrounding the semiconductor layer, wherein the barrier structure and the semiconductor layer are partially overlapped; and
    providing a functional layer comprising a step of providing the functional layer on the semiconductor layer surrounded by the barrier structure by means of inkjet print.

\* \* \* \* \*